United States Patent
Shaheen et al.

(10) Patent No.: US 7,670,928 B2
(45) Date of Patent: Mar. 2, 2010

(54) ULTRA-THIN OXIDE BONDING FOR S1 TO S1 DUAL ORIENTATION BONDING

(75) Inventors: Mohamad A. Shaheen, Portland, OR (US); Willy Rachmady, Beaverton, OR (US); Peter Tolchinsky, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 11/453,444

(22) Filed: Jun. 14, 2006
(Under 37 CFR 1.47)

(65) Prior Publication Data
US 2008/0099839 A1    May 1, 2008

(51) Int. Cl.
*H01L 21/30* (2006.01)
*H01L 21/46* (2006.01)

(52) U.S. Cl. .............. 438/455; 438/458; 438/459; 257/E21.125; 257/E21.568

(58) Field of Classification Search .......... 438/455, 438/458, 459; 257/E21.122, E21.125, E21.568
See application file for complete search history.

(56) References Cited

U.S. PATENT DOCUMENTS

| | | | |
|---|---|---|---|
| 4,254,426 A | 3/1981 | Pankove | |
| 5,124,777 A | 6/1992 | Lee | |
| 5,346,839 A | 9/1994 | Sundaresann | |
| 5,545,586 A | 8/1996 | Koh | |
| 5,563,077 A | 10/1996 | Ha | |
| 5,578,513 A | 11/1996 | Maegawa | |
| 5,647,917 A | 7/1997 | Oida et al. | |
| 5,658,806 A | 8/1997 | Lin et al. | |
| 5,661,581 A | 8/1997 | Mushiage et al. | |
| 5,701,016 A | 12/1997 | Burroughes et al. | |
| 5,716,879 A | 2/1998 | Choi et al. | |
| 5,932,048 A | 8/1999 | Furukawa et al. | |
| 5,949,108 A | 9/1999 | Doyle | |
| 5,958,132 A | 9/1999 | Takahashi et al. | |
| 5,981,400 A * | 11/1999 | Lo ............................. 438/745 | |

(Continued)

FOREIGN PATENT DOCUMENTS

EP    0623963    11/1994

(Continued)

OTHER PUBLICATIONS

Auth et al., "Vertical, Fully-Depleted, Surroundings Gate MOSFETS On sub-0.1 um Thick Silicon Pillars", 1996 54$^{th}$ Annual Device Reseach Conference Digest, pp. 108-109 (1996).

(Continued)

*Primary Examiner*—Alexander G Ghyka
*Assistant Examiner*—Seahvosh J Nikmanesh
(74) *Attorney, Agent, or Firm*—Blakely, Sokoloff, Taylor & Zafman LLP

(57) ABSTRACT

A multi-layered substrate with bulk substrate characteristics and processes for the fabrication of such substrates are herein disclosed. The multi-layered substrate can include a first layer, a second layer and an interfacial layer therebetween. The first and second layers can be silicon, germanium, or any other suitable material of the same or different crystal orientations. The interfacial layer can be an oxide layer from about 5 Angstroms to about 50 Angstroms.

15 Claims, 5 Drawing Sheets

U.S. PATENT DOCUMENTS

| | | | |
|---|---|---|---|
| 6,051,452 | A | 4/2000 | Shigyo et al. |
| 6,171,965 | B1* | 1/2001 | Kang et al. ............... 438/695 |
| 6,228,691 | B1 | 5/2001 | Doyle |
| 6,251,754 | B1 | 6/2001 | Ohshima et al. |
| 6,375,738 | B1 | 4/2002 | Sato |
| 6,376,317 | B1 | 4/2002 | Forbes et al. |
| 6,413,802 | B1 | 7/2002 | Hu et al. |
| 6,475,869 | B1 | 11/2002 | Yu |
| 6,483,156 | B1 | 11/2002 | Adkisson et al. |
| 6,525,403 | B2 | 2/2003 | Inaba et al. |
| 6,534,381 | B2 | 3/2003 | Cheung et al. |
| 6,558,802 | B1 | 5/2003 | Henley et al. |
| 6,562,665 | B1 | 5/2003 | Yu |
| 6,611,029 | B1 | 8/2003 | Ahmed et al. |
| 6,624,049 | B1 | 9/2003 | Yamazaki |
| 6,645,797 | B1 | 11/2003 | Buynoski et al. |
| 6,645,831 | B1 | 11/2003 | Shaheen et al. |
| 6,680,240 | B1 | 1/2004 | Maszara |
| 6,709,982 | B1 | 3/2004 | Buynoski et al. |
| 6,716,684 | B1 | 4/2004 | Krivokapic et al. |
| 6,730,964 | B2 | 5/2004 | Horiuchi |
| 6,756,657 | B1 | 6/2004 | Zhang et al. |
| 6,833,195 | B1 | 12/2004 | Lei et al. |
| 6,884,154 | B2 | 4/2005 | Mizushima et al. |
| 6,890,838 | B2* | 5/2005 | Henley et al. ............ 438/475 |
| 6,908,027 | B2 | 6/2005 | Tolchinsky et al. |
| 6,911,380 | B2 | 6/2005 | Tolchinsky et al. |
| 6,927,146 | B2 | 8/2005 | Brask et al. |
| 7,042,009 | B2 | 5/2006 | Shaheen et al. |
| 2002/0011612 | A1 | 1/2002 | Hieda |
| 2002/0036290 | A1 | 3/2002 | Inaba et al. |
| 2002/0081794 | A1 | 6/2002 | Ito |
| 2002/0167007 | A1 | 11/2002 | Yamazaki et al. |
| 2003/0057486 | A1 | 3/2003 | Gambino et al. |
| 2003/0085194 | A1 | 5/2003 | Hopkins |
| 2003/0102497 | A1* | 6/2003 | Fried et al. ............... 257/255 |
| 2004/0036126 | A1 | 2/2004 | Chau et al. |
| 2004/0119100 | A1* | 6/2004 | Nowak et al. ............ 257/204 |
| 2004/0256647 | A1 | 12/2004 | Lee et al. |
| 2004/0262686 | A1 | 12/2004 | Shaheen et al. |
| 2005/0026394 | A1* | 2/2005 | Letertre et al. ............ 438/459 |
| 2005/0042842 | A1 | 2/2005 | Lei et al. |
| 2005/0067377 | A1 | 3/2005 | Lei et al. |
| 2005/0118790 | A1 | 6/2005 | Lee et al. |
| 2005/0173781 | A1 | 8/2005 | Tolchinsky et al. |
| 2005/0194593 | A1* | 9/2005 | Ramdani et al. ............ 257/52 |
| 2005/0217560 | A1 | 10/2005 | Tolchinsky et al. |
| 2005/0224797 | A1 | 10/2005 | Ko et al. |
| 2006/0043483 | A1 | 3/2006 | Shaheen et al. |
| 2006/0054891 | A1* | 3/2006 | Chu et al. ................. 257/65 |
| 2006/0071299 | A1 | 4/2006 | Doyle et al. |
| 2006/0138583 | A1* | 6/2006 | Henley ..................... 257/499 |
| 2008/0164572 | A1* | 7/2008 | Toyoda et al. ............ 257/616 |

FOREIGN PATENT DOCUMENTS

| | | |
|---|---|---|
| EP | 1202335 | 5/2002 |
| EP | 1566844 | 8/2005 |
| JP | 2-255304 | 10/1990 |
| JP | 2003298051 | 10/2003 |
| WO | WO 02/43151 | 5/2002 |

OTHER PUBLICATIONS

Bourdelle, K.L., et al., "Smart Cut Transfer of 300 mm (110) and (100) Si layers for Hybrid Orientation Technology", 2004 IEEE International SOI Conference, Oct. 2004, pp. 98-99.

Brask, J.K., et al., "Semiconductor Device Structures and Methods of Forming Semiconductor Structures" U.S. Appl. No. 11/158,661, filed Jun. 21, 2005.

Burenkov A., et al.,; "Corner effect in Double and Triple Gate FinFET's", European Solid-State Device Research 2003, 33rd Conference on ESSDERC, Sep. 16, 2003; pp. 135-138.

Chang, L., et al., "CMOS Circuit Performance Enhancement by Surface Orientation Optimization", IEEE Transactions on Electron Devices, vol. 51, No. 10, Oct. 2004, pp. 1621-1627.

Chang, S.T., "3-D Simulation of Strained S/SiGe heterojunction FinFets", Semiconductor Device Research Symposium, 2003 International Dec. 10-12, 2003. Piscataway, NJ, USA, IEEE, Dec. 2003, pp. 176-1.

Christiansen, S.H., et al; "Strained silicon on insulator (SSOI) by waferbonding", Science Direct; Dec. 22, 2004; Elsevier; pp. 197-202.

Doris, B. et al., "A Simplified Hybrid Orientation Technology (SHOT) for High Performance CMOS", 2004 Symposium on VLSI Technology Digest of Technical Papers, pp. 86-87.

Farrens, S., et al.; Contemporary bonding tools have eased the transition from "discrete" planar layouts of ICs and MEMS devices to integrated smart MEMs and vertically integrated ICs.; www.chipscalereview.com/archives/0105/article; 5 pages.

Hisamoto et al., "A Folded-Channel MOSFET for Deepsub-tenth Micron Era", 1998 IEEE International Electron Device Meeting Technical Digest, pp. 1032-1034 (1998).

Hisamoto, D. et al, "FinFET—A Self-Aligned Double-Gate MOSFET Scalable to 20 nm", IEEE Transactions on Electron Devices, vol. 47, No. 12, Dec. 2000, pp. 2320-2325.

Hisamoto, et al., "A Fully Depleted Lean-Channel Transistor (DELTA)—A Novel Vertical Ultrahin SOI MOSFET", IEEE Electron Device Letters, V, 11 (1), pp. 36-38 (1990).

Huang, et al., "Sub 50 nm FinFET: PMOS", 1999 IEEE International Electron Device Meeting Technical Digest, pp. 67-70 (1999).

International Search Report PCT/US 03/26242.

International Search Report PCT/US 03/39727.

International Search Report PCT/US 03/40320.

Park, J. et al., "Pi-Gate SOI MOSFET" IEEE Electron Device Letters, vol. 22, No. 8, Aug. 2001, pp. 405-406.

Park, T., et al., Fabrication of Body-Tied FinFETs (Omega MOSFETs) Using Bulk Si Wafers. (This work in part supported by Tera Level Nanodevices Project of MOST in 2002) (2 pages).

PCT Int'l Search Report for Int'l Application No. PCT/US2005/020339, Filing Date Jun. 9, 2005, mailed Oct. 4, 2005 (12 pages).

PCT International Search Report for PCT Application No. PCT/US 2005/010505. Mailed Aug. 8, 2005; 24 pages.

Radu, V.; "Layer transfer of semiconductors and complex oxides by helium and/or hydrogen implantation and wafer bonding"; Halle (Saale), Nov. 4, 2003, 104 pages.

Romanov, A.; An approach to threading dislocation "reaction kinetics"; Appl. Phys. Lett. 69 (22), Nov. 25, 1996; 1996 American Institute of Physics; pp. 3342-3344.

Sayama, H., et al., Effect of <100 > Channel Direction for High Performace SCE Immune pMOSFET with Less Than 0.15um Gate Length, ULSI Development Center; Advanced Technology R & D Center, Mitsubishi Electric Corp.; 4-1 Mizuhara, Itami, Hyogo 664-8641, Japan, © 1999 IEEE 99-657, pp. 27.5.1-27.5.4.

Subramanian, V. et al., "A Bulk-Si-Compatible Ultrahin-body SOI Technology for Sub-100m MOSFETS" Proceeding of the 57th Annual Device Research Conference, pp. 28-29 (1999).

Sung, C.Y., et al., "High Performace CMOS Bulk Technology Using Direct Silicon Bond (DSB) Mixed Crystal Orientation Substrates," 2005 IEEE, 4 pages.

U.S. Appl. No. 11/332,189, "High Mobility Tri-Gate Devices and Methods of Fabrication" filed Jan. 12, 2006.

U.S. Appl. No. 11/377,475, filed Mar. 15, 200, "Formation of a Multiple Crystal Orientation Substrate".

Yang, M. et al., "High Performance CMOS Fabricated on Hybrid Substrate with Different Crystal Orientations", IEDM 03-453, pp. 18.7.1-18.7.4.

Yang, M., et al., "On the Integration of CMOS with Hybrid Crystal Orientations", 2004 Symposium on VLSI Technology Digest of Technical papers, 160-161.

* cited by examiner

ULTRA-THIN OXIDE BONDING FOR S1 TO S1 DUAL ORIENTATION BONDING

FIELD OF INVENTION

Semiconductor processes.

BACKGROUND OF INVENTION

Wafer-to-wafer bonding techniques are used to create substrates with varying layer-to-layer characteristics for a variety of different applications. For example, wafer-to-wafer bonding, i.e., wafer bonding, can allow the formation of device layer stacks that otherwise cannot be grown or deposited with conventional thin film methods with the same material qualities required for high device performance Wafer bonding techniques typically employ at least two wafer substrates, referred to as a handle wafer and a donor wafer, as starting materials. Wafer bonding is generally done in three basic operations: (1) cleaning and surface activation of the handle wafer and the donor wafer prior to bonding; (2) bringing into contact the treated and cleaned surfaces of the handle wafer and the donor wafer; and (3) post-anneal processing to seal the bond.

In some applications, a substrate of varying layers having different crystal orientations is desired. "Crystal orientation" refers to the crystal lattice structure of materials used in the fabrication of semiconductor substrates. Crystal orientation planes of silicon are typically represented as (100), (110) and (111) and are representatively shown in FIG. 1. Monocrystalline silicon is an anisotropic material, meaning that the properties of monocrystalline silicon change depending on the direction from which they are measured within the crystal lattice of silicon. This may be explained by the different atomic densities within each of the (100), (110), and (111) crystal planes that are illustrated in FIG. 1. The atomic densities of the (100) crystal plane, the (110) crystal plane, and the (111) crystal plane are illustrated in FIG. 1. Examples of properties that change with the direction in silicon include the Young's Modulus (a measure of the strength of the material), the mobility of electrons (or holes), the etch rate, and the oxidation rate. For example, the Young's modulus of silicon is 1.3 $e^{12}$ dynes/$cm^2$ in the (100) crystal plane, 1.7 $e^{12}$ dynes/$cm^2$ in the (110) crystal plane, and 1.9 $e^{12}$ dynes/$cm^2$ in the (111) crystal plane. As another example, the mobility of electrons in the (100) crystal plane is known to be greater than in the (110) crystal plane of silicon, resulting in a current drivability in the (100) direction that is approximately 15 percent (%) greater than the current drivability in the (110) direction.

Substrates of varying layers having different crystal orientations can have a high degree of lattice mismatch. "Lattice mismatch" is the percentage difference between atom spacings along a plane of the same crystallographic orientation as the interface plane in the respective bulk phases of the two materials. In certain instances, lattice mismatch can lead to device degradation in semiconductor devices. Thus, an interfacial layer is generally required to accommodate lattice mismatch between layers of different crystal orientations in multi-layered substrates.

In some wafer bonding techniques resulting in substrates of different crystal orientations, hydrophilic bonding can be used. For example, a thick layer of oxide is formed on a donor wafer. The oxide layer can be in the range from 300 Angstroms (Å) to 3000 Angstroms. The wafer surfaces are typically terminated in hydrophilic hydroxyl groups, such as Si—OH groups. The donor wafer is subsequently bonded to the handle wafer by contacting the treated surfaces of the respective wafers to each other with heat applied thereto. Prior to bonding, one of the wafers is implanted with hydrogen to establish the 'breakline' for predetermined thickness of the top silicon portion of the bonded wafer. When the bonded wafer is treated with heat, the implanted hydrogen line breaks and thus a wafer with an imbedded thick oxide layer is formed. Thus, the result is a hybrid crystal orientation substrate with a thick oxide layer in between the respective crystal orientation layers.

Imbedded thick oxide bonding produces a wafer with imbedded isolation (buried oxide, or BOX) which has different device characteristics than standard bulk silicon. This requires completely different circuit design. In addition, the interfacial oxide layer acts as an insulator and the resulting hybrid substrate has silicon-on-insulator (SOI) characteristics.

In some wafer bonding techniques resulting in substrates of different crystal orientations, hydrophobic bonding can be used. The process requires high temperatures and expensive equipment. For example, a handle wafer can be treated with hydrofluoric acid. A donor wafer can be implanted with hydrogen ions resulting in an implanted wafer. Before contacting the treated surfaces, the handle wafer must be subjected to a pre-anneal process to obtain a surface free of hydrogen (H) and hydroxyl (OH) groups. In some applications, the pre-anneal process is conducted at 650 degrees Celsius (° C.). Similar to the handle wafer, the implanted wafer must be processed by a krypton-fluoride excimer laser to obtain a surface substantially free of H and OH groups. Thereafter, the handle wafer and the implanted wafer can be contacted for wafer bonding. The result is a substrate which may include layers of different crystal orientations formed by high temperature and laser treatment.

DETAILED DESCRIPTION

A multi-layered substrate with bulk substrate characteristics and processes for the fabrication of such substrates are herein disclosed. The multi-layered substrate can include a first layer, a second layer and an interfacial layer therebetween. The first and second layers can be silicon, germanium, or any other suitable material of the same or different crystal orientations. The interfacial layer can be an oxide layer from about 3 Angstroms to about 100 Angstroms.

Figure 1:
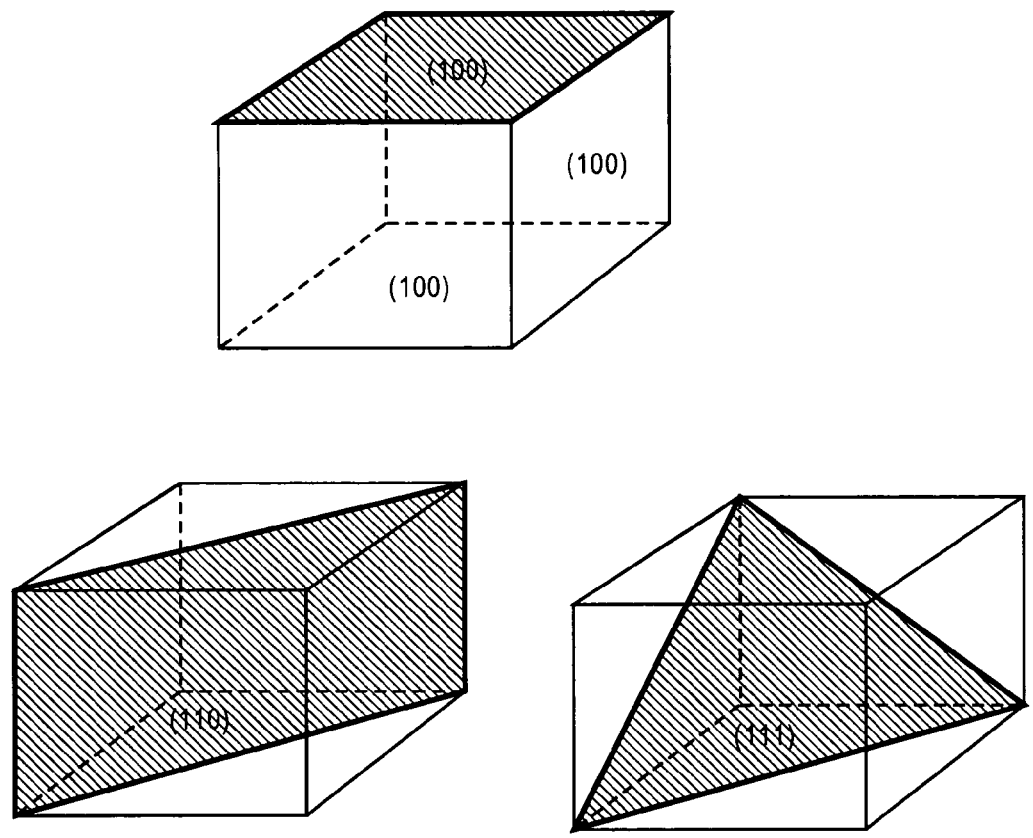
FIG. 1 illustrates crystal orientations.
Figure 2:
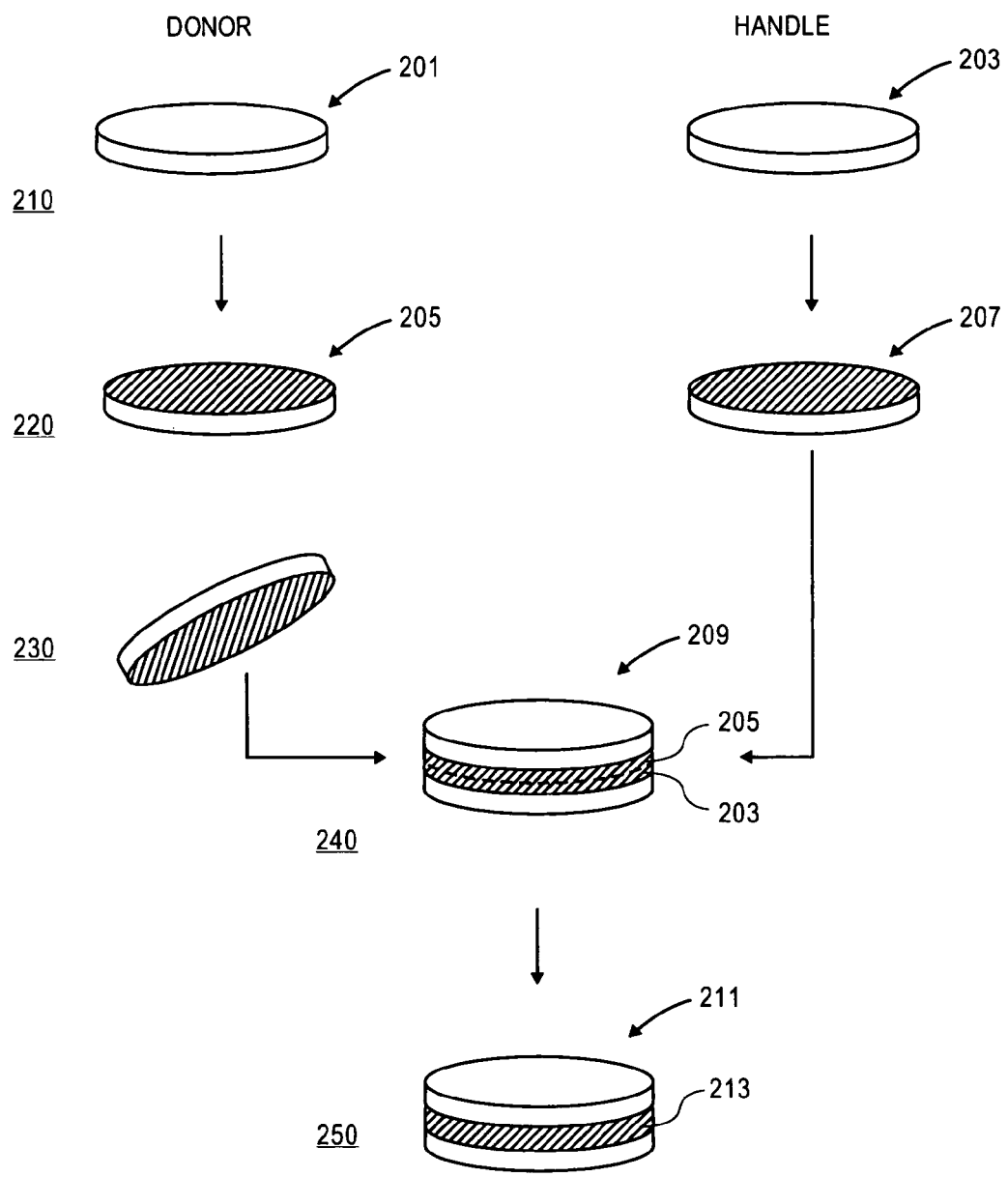
FIG. 2 illustrates an embodiment of forming a multi-layer substrate with bulk substrate characteristics.

FIG. 2 illustrates an embodiment of forming a multi-layer substrate that, in one aspect, has bulk substrate characteristics. A first wafer 201 and a second wafer 203 may be the starting materials for forming a multi-layer substrate (210). In some embodiments, first wafer 201 is a donor wafer and second wafer 203 is a handle wafer, hereinafter referred to as donor wafer 201 and handle wafer 203. Each of donor wafer 201 and handle wafer 203 can be a semiconductor material such as silicon, germanium, a combination of silicon and germanium, or any other suitable material (and combinations thereof) used in semiconductor fabrication processes. The materials may be doped with other materials such as, but not limited to, phosphorous (P), boron (B) and beryllium (Be), among other N or P dopant types. In some embodiments, donor wafer 201 may be implanted with hydrogen atoms.

In some embodiments, donor wafer 201 may have crystal orientation (100), (110) or (111). Independent of the wafer plane, the notch direction may be in the direction of [100], [110] or [111]. Similarly, in some embodiments, handle wafer 203 may have crystal orientation (100), (110) or (111) and independent notch directions of [100], [110] or [111]. Thus, donor wafer 201 and handle wafer 203 may comprise the same or different crystal orientations depending on the intended application of the resulting multi-layer substrate.

Oxide layers 205 and 207 can be formed on one or both of donor wafer 201 and handle wafer 203, respectively (220). Examples of materials which can be used for oxide layers 205 and 207, include but are not limited to, silicon dioxide ($SiO_2$), silicon nitride ($Si_3N_4$), plasma oxide and chemical oxide, or high-dielectric constant based oxides such as hafnium oxide. Oxide layer formation can be performed by a variety of methods, including, but not limited to, ambient native growth, chemical growth, chemical vapor deposition (CVD), RF sputtering, atomic layer deposition (ALD), low pressure CVD, plasma-enhanced CVD or any other suitable process. It should be appreciated that in some embodiments, an oxide layer can be formed on the donor wafer, the handle wafer or both wafers.

In some embodiments, ambient native growth forms oxide layers 205 and 207. Donor wafer 201 and handle wafer 203 may first be cleaned by such processes including, but not limited to, wet-chemistry wafer cleaning processes. In some embodiments, hydrogen-peroxide-based wet cleans can be used. For example, dilute HF Standard Clean-1 (SC-1) and Standard Clean-2 (SC-2) can be used sequentially on wafers 201 and 203. Wafers 201 and 203 can then be rinsed with deionized water with a resistivity of about 18 megaOhms centimeter. Subsequently, cleaned donor wafer 201 and handle wafer 203 may be left in ambient conditions for approximately six hours to approximately thirty-six hours for saturated growth. Ambient conditions can be room temperature (approximately 21° C. to 23° C.) at approximately one atmosphere. Ambient native growth can result in an oxide layer of, for example, approximately 8 Angstroms to approximately 25 Angstroms.

In some embodiments, donor wafer 201 and handle wafer 203 can be dipped in a solution for formation of oxide layers 205 and 207. Examples of solutions include, but are not limited to, peroxide solutions, such as hydrogen peroxide ($H_2O_2$) solutions and SC1/SC2 solutions. Wafers 201 and 203 should be stripped of any native oxide that has grown in ambient conditions. Thus, a cleaning process, such as the one described previously, should be performed before formation of chemical oxide layers 205 and 207. In one embodiment, cleaned donor wafer 201 and handle wafer 203 may be dipped into a bath of 7% solution of hydrogen peroxide for a time from between 60 seconds and 600 seconds to form oxide layers 205 and 207, respectively. Dipping in peroxide can result in an oxide layer of, for example, approximately 15 Angstroms. In another embodiment, cleaned donor wafer 201 and handle wafer 203 may be dipped into baths of SC1 and SC2 solutions for a time from between 60 seconds and 600 seconds to form oxide layers 205 and 207, respectively. Dipping in SC1/SC2 can result in an oxide layer of, for example, approximately 3 Angstroms.

In some embodiments, chemical vapor deposition forms oxide layers 205 and 207. Wafers 201 and 203 should be stripped of any native oxide that has grown in should be performed before formation of oxide layers 205 and 207. An example of a process to grow this oxide would involve annealing at about 900° C. of Si in a flow of oxygen or steam (wet oxidation) for approximately 30 to 100 seconds. This results in an oxide layer of, for example, from approximately 3 Angstroms to approximately 10 Angstroms.

After formation of oxide layers 205 and 207, donor layer 201 can be brought into contact with handle layer 203 by "flipping" donor layer 201 onto handle layer 203 (230). Donor layer 201 should be situated relative to handle wafer 203 such that oxide layer 205 of donor layer 201 is in contact with oxide layer 207 of handle wafer 203 (240). Wafers 201 and 203 are brought into contact to initiate bonding (contact bonding) as point bonding or full face bonding. "Point bonding" is when the bonding is initiated at a single point and the bonding wave propagates across the wafer. "Full face bonding" is when pressure is applied across the whole wafer at the same time to induce bonding. After placing the wafers 201 and 203 in contact, a bond wave propagates until full bonding is achieved. Bond wave propagation occurs when two substances are put into contact with another at least one point. A wave initiates to seal the remaining points so that that the two substances are molecularly bonded by weak van der Waals forces. Bonding can be achieved from about 30 seconds to about 2 minutes. Bonding can be done under atmospheric conditions or vacuum conditions. At this point, weak molecular forces, i.e., van der Waals forces, hold the bonded donor wafer 201 and handle wafer 203 together resulting in a bonded substrate 209. Surface energy at the bonding interface is about 0.1 Joules per meter squared ($J/m^2$).

After contact bonding and bond wave propagation, a post-bonding anneal process can be applied to a resulting multi-layer substrate 211 to convert the weak molecular forces to chemical covalent bonds (250). "Anneal" is a high temperature process which can be employed in, for example, semiconductor fabrication processes. In some embodiments, a post-bonding anneal process can be in a range from approximately 400° C. to approximately 1200° C. for a time period between about 2 hours to about 10 hours. Although bonding is achieved in contact bonding, strengthening bonding to form covalent bonds (such as by post-bonding anneal processes) may be further applied to multi-layer substrate 211 to strengthen the bond between donor wafer 201 and handle wafer 203. After the post-bonding anneal process, the bond energy is increased to about 2.0 ($J/m^2$) and multi-layer substrate 211 may be subjected to further processing, such as grinding.

Multi-layer substrate 211 includes ultra-thin oxide layer 213. Oxide layer 213 can be in a range from about 5 Angstroms to about 100 Angstroms, and more particularly, from about 5 Angstroms to about 50 Angstroms. In some embodiments, oxide layer 213 is approximately 5 Angstroms. Representative examples in which oxide layer 213 may be approximately 5 Angstroms include Logic transistor devices. In some embodiments, oxide layer 213 is approximately 15 Angstroms to 25 Angstroms. Representative examples in which oxide layer 213 may be approximately 15 to 50 Angstroms include floating body Memory transistor devices. During the post-anneal process (250), moisture or hydrogen can form water ($H_2O$) or hydrogen gas ($H_2$) which gets absorbed in oxide layer 213, thus preventing formation of voids.

Figure 3:
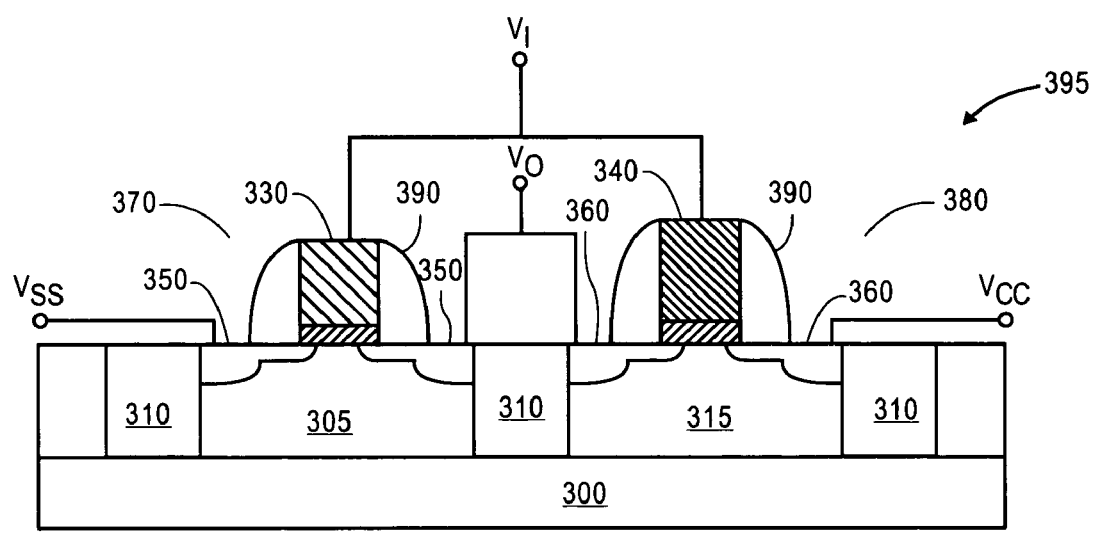
FIG. 3 illustrates an embodiment of a transistor on a multi-layer substrate with bulk substrate characteristics.

FIG. 3 illustrates an embodiment of a complementary metal-oxide-semiconductor (CMOS) transistor device formed on a multi-layer substrate. CMOS device 395 includes NMOS transistor 370 and PMOS transistor 380 on substrate 300 which, in some embodiments, may be a multi-layer substrate. Transistors 370 and 380 each include gate electrodes 330 and 340, respectively, and side walls 390 adjacent to gate electrodes 330 and 340. NMOS transistor includes p-type well 305 and junction regions 350 within substrate 300 and adjacent to gate electrode 330. PMOS transistor includes n-type well 315 and junction regions 360 within substrate 300 and adjacent to gate electrode 340. Regions 310 represent isolation areas between PMOS and NMOS transistor devices. CMOS devices are known by those skilled in the art.

"Voids" refer to local unbonded areas between two bonded surfaces. Accordingly, voids can accumulate in and around an interfacial layer between two substrates. Voids can result from particulate impurities or gases, particularly hydrogen gas or $H_2O$ vapor. In some applications, voids can result in incomplete bonding, low die-yield, low die quality and, in some cases, eventually device failure. In wafer bonding in which a thick oxide layer comprises the interfacial layer, i.e., 300 Angstroms to 3000 Angstroms, the thick oxide layer can absorb interfacial gases which result in voids. However, such thick oxide layers serve as insulators and isolate the underlying and overlying substrate materials from each other. Such configurations are typically referred to as silicon-on-insulator substrates. In some applications, the bonding process is preferably performed at room temperature to reduce the formation of voids. On the other hand, direct bonding, i.e., bonding without the employment of an oxide layer, can be performed at high temperatures, but at the risk of blistering of hydrogen-implanted wafers.

Figure 4:
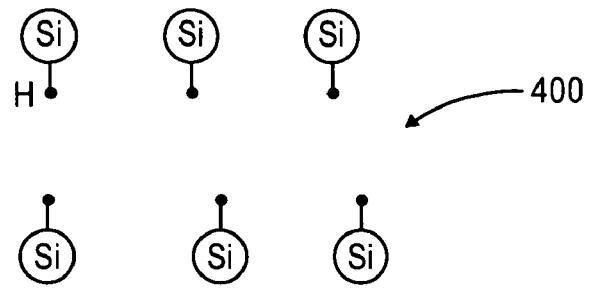
FIG. 4 illustrates an embodiment of hydrophobic bonding between two substrates.

FIG. 4 depicts the chemistry of hydrophobic bonding, i.e., direct bonding between two wafers. In a post-bond anneal, Si—H reacts with Si—H to form $S_1$-$S_1$ and $H_2$. Thus, at interface 400, $H_2$ can become trapped forming voids. Additionally, in cases in which the wafers have different crystal orientations, misfit dislocations are expected.

Figure 5:
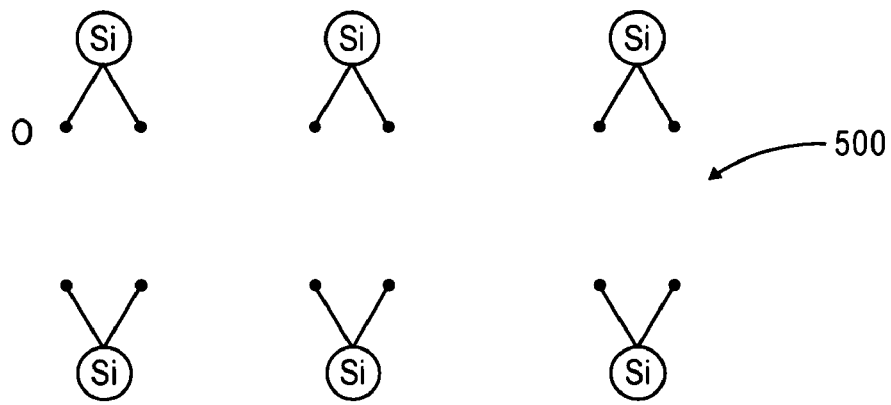
FIG. 5 illustrates an embodiment of hydrophilic bonding between two substrates.

FIG. 5 depicts the chemistry of hydrophilic bonding, i.e., bonding between two wafers with an oxide layer disposed therebetween, such as described with reference to FIG. 2. In a post-bond anneal, Si—O reacts with Si—O to form Si—O—Si. In some embodiments, interface 500 is an ultra-thin oxide layer of approximately 5 Angstroms to 25 Angstroms. It is anticipated that any residual $H_2$ or $H_2O$ is substantially or completely absorbed in the interfacial oxide 400. Also it is anticipated that the interface 400 oxide will accommodates crystal mismatch between different crystal orientations.

Figure 6:
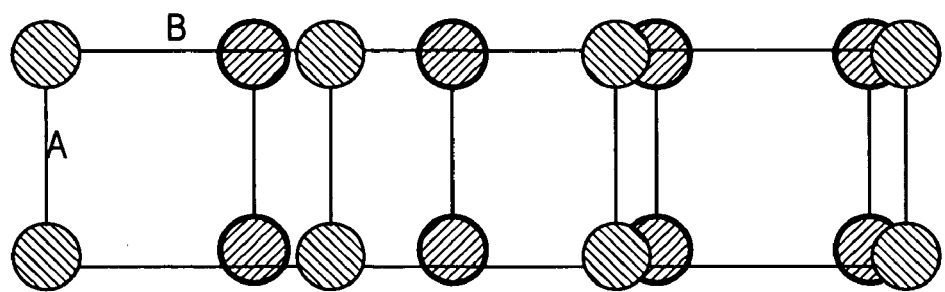
FIG. 6 illustrates an embodiment of lattice mismatch between two substrates with two different crystal orientations.

According to the above-described embodiments, ultra-thin oxide layer 213 allows multi-layer substrate 211 to behave as a bulk substrate thereby avoiding substrate isolation. SOI substrates exhibit different device characteristics than bulk silicon and each requires completely different circuit design. Bulk substrate characteristics include, but are not limited to, lack of floating body effects or self-heating. Thus, even though ultra-thin oxide layer 213 is interdisposed between wafer 201 and wafer 203, ultra-thin oxide layer 213 is sufficiently thin to allow multi-layer substrate 211 to behave as a bulk substrate. Moreover, ultra-thin oxide layer 213 can absorb interfacial gases, such as $H_2$ and $H_2O$ formed during the post-bond anneal process, which gases could otherwise result in voids. Additionally, full bonding can be done at room temperature which avoids complications associated with high temperature pre-heating of implanted wafers, i.e., direct bonding Also, ultra-thin oxide layer 213 can accommodate lattice mismatch between different crystal orientations. For example, bonding of (100) crystal orientation to (110) crystal orientation can result in a 40% mismatch. That is, one out of every four atoms are mismatched at the interface between (100) silica and (110) silica (see FIG. 6). Thus, ultra-thin oxide layer 213 may be needed due to the anticipated high density of dislocation between atoms. Ultra-thin oxide layer 213 allows the bonding for largely mismatched materials without formation of misfit or threading dislocations. "Misfit dislocation" refers to the mismatch between individual atoms of different crystal orientations. "Threading dislocation" refers to non-equilibrium defects that raise the free energy of a layer. Threading dislocations are deleterious for physical performance.

Figure 7:
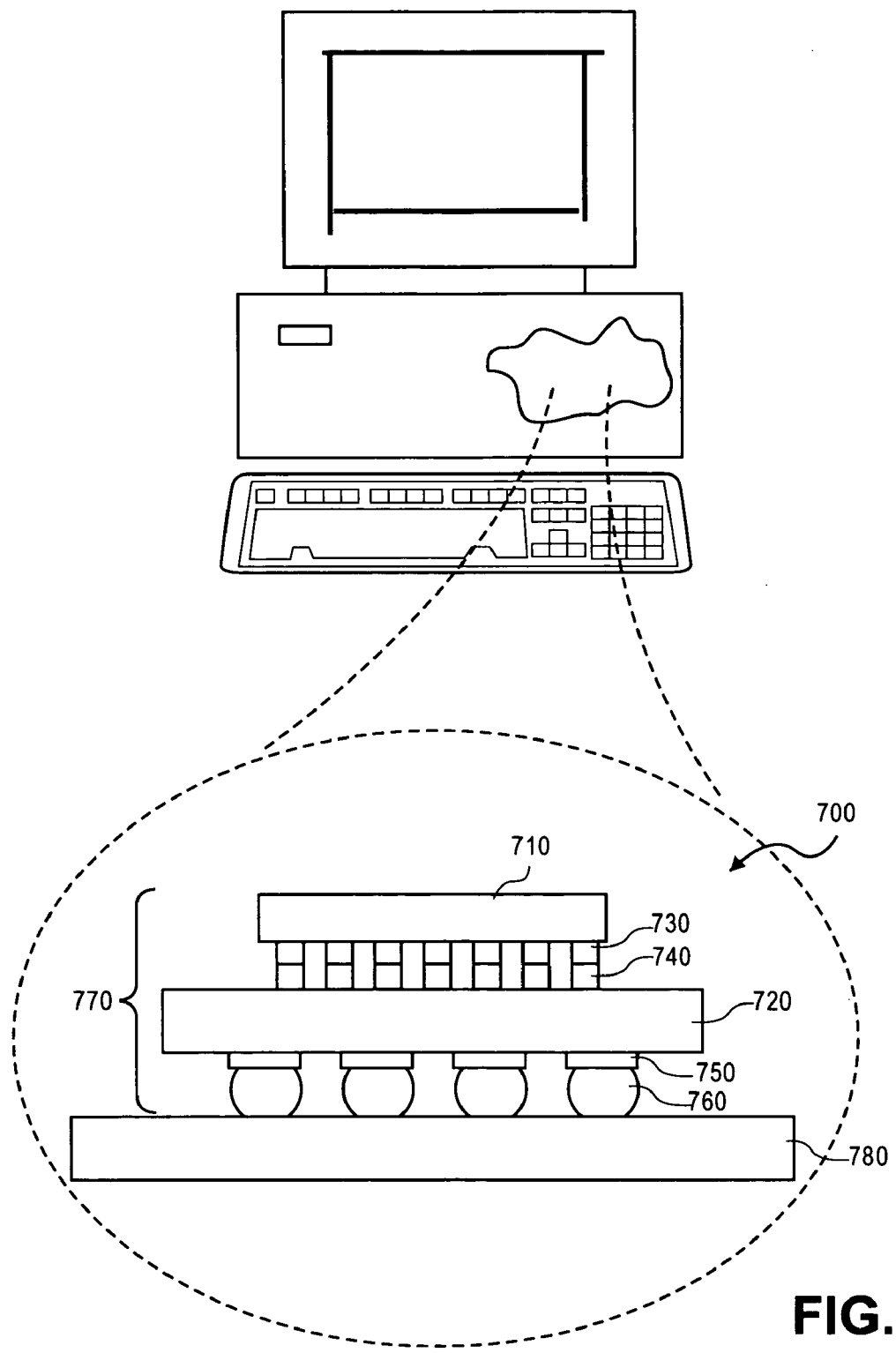
FIG. 7 shows a computer system including microprocessor enclosed by a package mounted to a printed circuit board.

FIG. 7 shows a cross-sectional side view of an integrated circuit package that is physically and electrically connected to a printed wiring board or printed circuit board (PCB) to form an electronic assembly. The electronic assembly can be part of an electronic system such as a computer (e.g., desktop, laptop, handheld, server, etc.), wireless communication device (e.g., cellular phone, cordless phone, pager, etc.), computer-related peripheral (e.g., printer, scanner, monitor, etc.), entertainment device (e.g., television, radio, stereo, tapes and compact disc player, video cassette recorder, motion picture expert group audio layer 3 player (MP3), etc.), and the like. FIG. 7 illustrates the electronic assembly as part of a desktop computer. FIG. 7 shows electronic assembly 700 including die 710, physically and electrically connected to package substrate 720. Die 710 is an integrated circuit die, such as a microprocessor die, having, for example, transistor structures interconnected or connected to power/ground or input/output signals external to the die through interconnect lines to contacts 730 on an external surface of die 710. The die may be formed in accordance with known wafer processing techniques using as the substrate the substrate described with reference to FIG. 2. Contacts 730 of die 710 may be aligned with contacts 740 making up, for example, a die bump layer on an external surface of package substrate 720. On a surface of package substrate 720 opposite a surface including contacts 740 are land contacts 750. Connected to each of land contacts 750 are solder bumps 760 that may be used to connect package 770 to circuit board 780, such as a motherboard or other circuit board.

Although the foregoing description has specified certain processes and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that wafer bonding to manufacture a silicon device is well known in the art. Therefore, it is appreciated that the figures provided herein illustrate only portions of an exemplary microelectronic device that pertains to the practice of embodiments of the present invention. Thus, the present invention is not limited to the structures described herein.

What is claimed is:

1. A method comprising:
   forming a first oxide layer on a first semiconductor layer of a first wafer;
   forming a second oxide layer on a second semiconductor layer of a second wafer;

contacting the first oxide layer to the second oxide layer to form a bulk substrate having an interfacial layer formed by the first oxide layer and the second oxide layer, wherein (i) the interfacial layer is interdisposed between the first layer and the second layer, (ii) the first layer comprises a first crystal orientation and the second layer comprises a second crystal orientation, (iii) the interfacial layer is less than 15 Angstroms thick; and (iv) the interfacial layer is substantially free of interfacial gases.

2. The method of claim 1, wherein the first crystal orientation is one of (100), (110) or (111).

3. The method of claim 1, wherein the second crystal orientation is one of (100), (110) or (111).

4. The method of claim 1, wherein the forming comprises:
contacting at room temperature to form a van der Waals bonded wafer; and
annealing the bonded wafer to form a chemical covalent bond.

5. The method of claim 4, further comprising grinding the bonded wafer.

6. The method of claim 4, wherein the forming is selected from the group consisting of ambient native growth, dipping, and chemical vapor deposition.

7. The method of claim 6, wherein the interfacial layer is substantially free of voids.

8. The method of claim 1, wherein at least one of the first layer and second layer is hydrogen implanted.

9. The method of claim 1 further comprising annealing the bulk substrate to form Si—O—Si and to absorb $H_2$ and $H_2O$ in the interfacial layer.

10. The method of claim 1 wherein the bulk substrate avoids substrate isolation, lacks floating body effects, and lacks self-heating.

11. A method comprising:
forming a first oxide layer on a first semiconductor wafer wherein the oxide layer has a thickness of less than 25 Angstroms;
forming a second oxide layer on a second semiconductor wafer wherein the oxide layer has a thickness of less than 25 Angstroms;
contacting the first oxide layer with the second oxide layer at room temperature to form a bulk substrate having an interfacial layer wherein a bonded multi-layer wafer is formed; and
annealing the bonded multi-layer wafer, wherein the first wafer has a first crystal orientation and the second wafer has a second crystal orientation, and wherein the interfacial layer is substantially free of voids and substantially free of interfacial gasses.

12. The method of claim 11, wherein the first crystal orientation is one of (100), (110) or (111).

13. The method of claim 12, wherein the second crystal orientation is one of (100), (110) or (111).

14. The method of claim 11 wherein annealing comprises forming Si—O—Si, and absorbing $H_2$ and $H_2O$ in the interfacial layer.

15. The method of claim 11 wherein the bulk substrate avoids substrate isolation, lacks floating body effects, and lacks self-heating.

* * * * *